(12) United States Patent
Chuang et al.

(10) Patent No.: US 7,898,037 B2
(45) Date of Patent: Mar. 1, 2011

(54) CONTACT SCHEME FOR MOSFETS

(75) Inventors: Harry Chuang, Austin, TX (US);
Kong-Beng Thei, Hsin-Chu (TW);
Mong Song Liang, Hsin-Chu (TW);
Jung-Hui Kao, Hsin-Chu (TW);
Sheng-Chen Chung, Hsin-Chu (TW);
Chung Long Cheng, Hsin-Chu (TW);
Shun-Jang Liao, Pingjhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 133 days.

(21) Appl. No.: 11/833,128

(22) Filed: Aug. 2, 2007

(65) Prior Publication Data

US 2008/0258228 A1 Oct. 23, 2008

Related U.S. Application Data

(60) Provisional application No. 60/925,046, filed on Apr. 18, 2007.

(51) Int. Cl.
*H01L 29/78* (2006.01)

(52) U.S. Cl. .................. 257/369; 257/774; 257/790

(58) Field of Classification Search .................. 257/774, 257/E21, E23, 790, 347, 369, 308; 438/6, 438/128, 598, 618, 193
See application file for complete search history.

(56) References Cited

U.S. PATENT DOCUMENTS

| | | | |
|---|---|---|---|
| 4,783,692 A | 11/1988 | Uratani | |
| 6,770,516 B2 | 8/2004 | Wu et al. | |
| 6,844,238 B2 | 1/2005 | Yeo et al. | |
| 6,924,560 B2 | 8/2005 | Wang et al. | |
| 7,005,330 B2 | 2/2006 | Yeo et al. | |
| 7,013,447 B2 | 3/2006 | Mathew et al. | |
| 7,074,656 B2 | 7/2006 | Yeo et al. | |
| 7,224,068 B2 * | 5/2007 | Tseng et al. | 257/774 |
| 7,462,538 B2 * | 12/2008 | Li et al. | 438/264 |
| 2003/0145299 A1 | 7/2003 | Fried et al. | |
| 2004/0119100 A1 | 6/2004 | Nowak et al. | |
| 2005/0023633 A1 | 2/2005 | Yeo et al. | |
| 2005/0111247 A1 * | 5/2005 | Takaura et al. | 365/2 |
| 2005/0136582 A1 | 6/2005 | Aller et al. | |
| 2005/0139893 A1 * | 6/2005 | Hofmann et al. | 257/314 |
| 2005/0140029 A1 * | 6/2005 | Li et al. | 257/790 |
| 2005/0224986 A1 * | 10/2005 | Tseng et al. | 257/762 |
| 2006/0138552 A1 * | 6/2006 | Brask et al. | 257/369 |
| 2006/0157737 A1 | 7/2006 | Lim et al. | |
| 2007/0026629 A1 | 2/2007 | Chen et al. | |
| 2007/0093029 A1 | 4/2007 | Dao | |
| 2007/0207590 A1 | 9/2007 | Kiyotoshi et al. | |
| 2008/0258228 A1 | 10/2008 | Chuang et al. | |
| 2008/0296691 A1 | 12/2008 | Chuang et al. | |

* cited by examiner

*Primary Examiner*—Wai-Sing Louie
*Assistant Examiner*—Sue Tang
(74) *Attorney, Agent, or Firm*—Haynes and Boone, LLP

(57) ABSTRACT

A semiconductor structure and methods of forming the same are provided. The semiconductor structure includes a semiconductor substrate; a first inter-layer dielectric (ILD) over the semiconductor substrate; a contact extending from a top surface of the first ILD into the first ILD; a second ILD over the first ILD; a bottom inter-metal dielectric (IMD) over the second ILD; and a dual damascene structure comprising a metal line in the IMD and a via in the second ILD, wherein the via is connected to the contact.

13 Claims, 8 Drawing Sheets

CONTACT SCHEME FOR MOSFETS

This application claims the priority of the following provisionally filed U.S. patent application: Application Ser. No. 60/925,046, filed Apr. 18, 2007, entitled "3-Dimensional Device Design Layout," which patent application is incorporated herein by reference.

TECHNICAL FIELD

This invention relates generally to integrated circuits, and more particularly to contact formation schemes, and even more particularly to the contacts for connecting Fin field-effect transistors (FinFET).

BACKGROUND

In modern integrated circuits, semiconductor devices are formed on semiconductor substrates, and are connected through metallization layers. The metallization layers are connected to the semiconductor devices through contacts, also referred to as contact plugs. Also, external pads are connected to the semiconductor devices through the contacts.

Typically, the formation process of contacts includes forming an inter-layer dielectric (ILD) over semiconductor devices, forming contact openings in the ILD, and filling a metallic material in the contact openings. However, with the increasing down-scaling of integrated circuits, the above-discussed processes experience shortcomings. While the horizontal dimensions, such as the widths of contacts, are continuously shrinking, the thickness of the ILD is not reduced accordingly to the same scale as the widths. Accordingly, the aspect ratios of contacts continuously increase, causing the contact formation process to be more and more difficult.

The difficulty is further increased for forming contacts to Fin field-effect transistors (FinFET). FinFETs are widely used since they use less chip area. FIG. 1 illustrates a FinFET structure. Gate 4 crosses three fins 2, and the portions of fins 2 not covered by gate 4 are used to form source and drain regions. The source regions of the three FinFETs are interconnected, and the drain regions of the FinFETs are interconnected. Therefore, the three FinFETs act as a single FinFET. The introduction of FinFETs has the advantageous feature of increasing drive current without the cost of occupying more chip area. However, it is difficult to form contacts to fins 2. Since the fins 2 of the FinFETs have small dimensions, the landing areas for the corresponding contacts are small. To ensure that contacts land on the fins, the landing areas need to be increased. One of the previous solutions is shown in FIG. 1, wherein landing pads 6 are formed and connected to fins 2. Landing pads 6 may be formed of the same material, and by the same process, as fins 2. The contacts to the source and drain regions can thus be easily landed on landing pads 6. However, landing pads 6 themselves occupy chip area, and hence such a solution defeats the purpose of forming FinFETs, which is to save chip area.

Accordingly, what is needed in the art is a contact structure and formation methods for solving the above-discussed problems.

SUMMARY OF THE INVENTION

In accordance with one aspect of the present invention, a semiconductor structure includes a semiconductor substrate; a first inter-layer dielectric (ILD) over the semiconductor substrate; a contact extending from a top surface of the first ILD into the first ILD; a second ILD over the first ILD; a bottom inter-metal dielectric (IMD) over the second ILD; and a dual damascene structure comprising a metal line in the IMD and a via in the second ILD, wherein the via is connected to the contact.

In accordance with another aspect of the present invention, a semiconductor structure includes a substrate; and a first Fin field-effect transistor (FinFET) and a second FinFET at a top surface of the substrate. The first FinFET includes a first fin; a first gate dielectric on a top surface and sidewalls of the first fin; a first gate electrode on the first gate dielectric; a first source/drain region in a portion of the first fin uncovered by the first gate dielectric; a first source/drain silicide region on the first source/drain region and a second FinFET at the top surface of the semiconductor substrate. The second FinFET includes a second fin; a second gate dielectric on a top surface and sidewalls of the second fin; a second gate electrode on the second gate dielectric; a second source/drain region in a portion of the second fin uncovered by the second gate dielectric; and a second source/drain silicide region on the second source/drain region. The semiconductor structure further includes a first inter-layer dielectric (ILD) over the first and the second FinFETs; a second ILD over the first ILD; and a contact electrically connected to the first and the second source/drain silicide regions, wherein the contact has a top surface substantially level with a top surface of the first ILD.

In accordance with yet another aspect of the present invention, a method for forming a semiconductor structure includes providing a semiconductor substrate; forming a first inter-layer dielectric (ILD) over the semiconductor substrate; forming a contact extending from a top surface of the first ILD into the first ILD; forming a second ILD over the first ILD; forming an inter-metal dielectric (IMD) over the second ILD; and forming a dual damascene structure comprising a metal line in the IMD and a via in the second ILD, wherein the via contacts the contact.

In accordance with yet another aspect of the present invention, a method for forming a semiconductor structure includes providing a substrate; and forming a first FinFET and a second FinFET at a top surface of the substrate. The first FinFET includes a first fin; a first gate dielectric on a top surface and sidewalls of the first fin; a first gate electrode on the first gate dielectric; a first source/drain region in a portion of the first fin uncovered by the first gate dielectric; and a first source/drain silicide region on the first source/drain region. The second FinFET includes a second fin over the substrate; a second gate dielectric on a top surface and sidewalls of the second fin; a second gate electrode on the second gate dielectric; a second source/drain region in a portion of the second fin uncovered by the second gate dielectric; and a first source/drain silicide region on the first source/drain region. The method further includes forming a first inter-layer dielectric (ILD) over the substrate; forming a contact electrically connected to the first and the second source/drain silicide regions, wherein the contact has a top surface substantially level a top surface of the first ILD; and forming a second ILD over the first ILD.

The advantageous features of the present invention include reduced aspect ratios of contacts and reduced manufacturing cost due to the combination of forming contacts and forming gate electrodes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel contact structure and the method of forming the same are presented. The intermediate stages of manufacturing a preferred embodiment of the present invention are illustrated. The variations of the preferred embodiment are then discussed. Each figure may have a suffix A, B or C, indicating different views of a same structure. Throughout the various views and illustrative embodiments of the present invention, like reference numbers are used to designate like elements.

Figure 1:
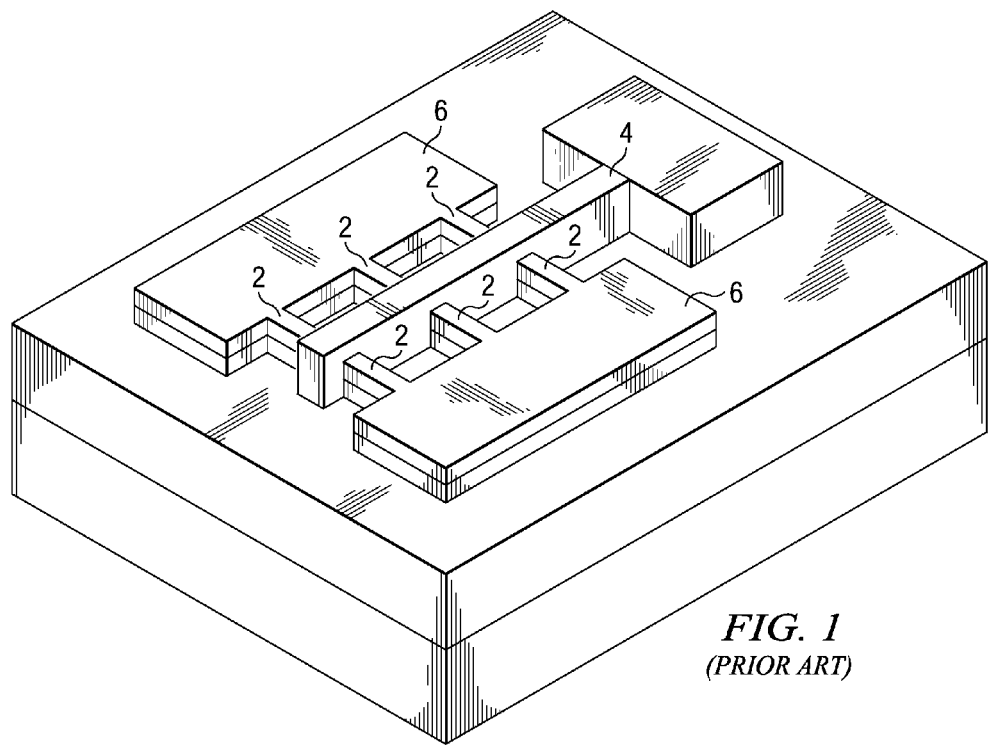
FIG. 1 illustrates a conventional Fin field-effect transistor (FinFET) formed of three FinFETs, wherein landing pads are formed in order to form contacts.
Figure 2A:
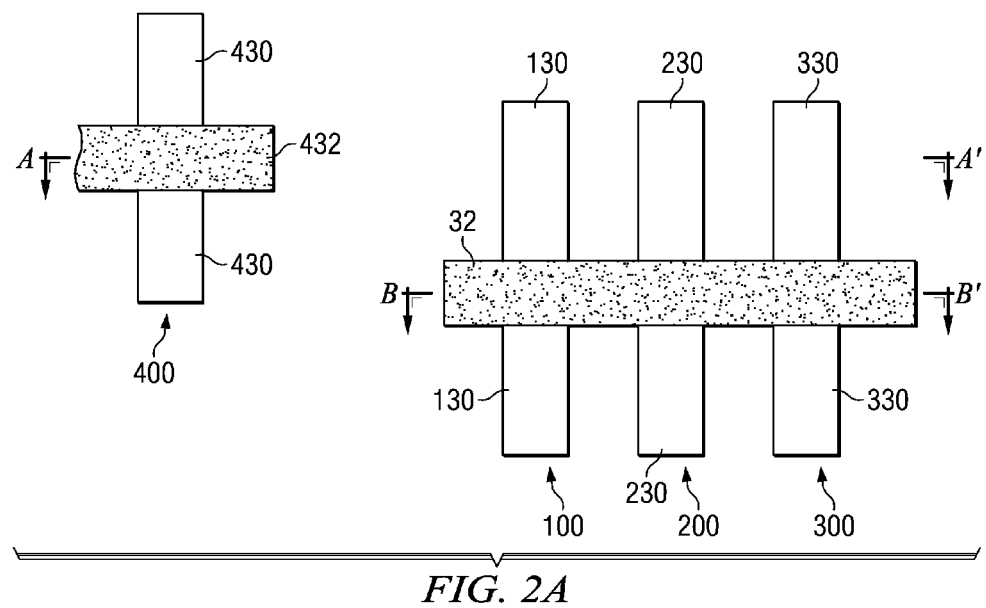
FIGS. 2A through 8 are top views and cross-sectional views of intermediate stages in the manufacturing of a first embodiment of the present invention.

FIGS. 2A through 8 illustrate a first embodiment of the present invention. FIG. 2A illustrates a top view of a semiconductor structure, which includes FinFETs 100, 200, 300 and 400. FinFETs 100, 200 and 300 are parallel to each other and are closely located. Gate electrode strip 32 extends across FinFETs 100, 200 and 300. FIG. 2C is a cross-sectional view of the structure shown in FIG. 2A, wherein the cross-sectional view is taken along a plane across line B-B'. Gate electrode strip 32 and gate dielectric 134 form the gate stack of FinFET 100. Gate electrode strip 32 and gate dielectric 234 form the gate stack of FinFET 200. Gate electrode strip 32 and gate dielectric 334 form the gate stack of FinFET 300. Therefore, the gates of FinFETs 100, 200 and 300 are interconnected.

Figure 2B:
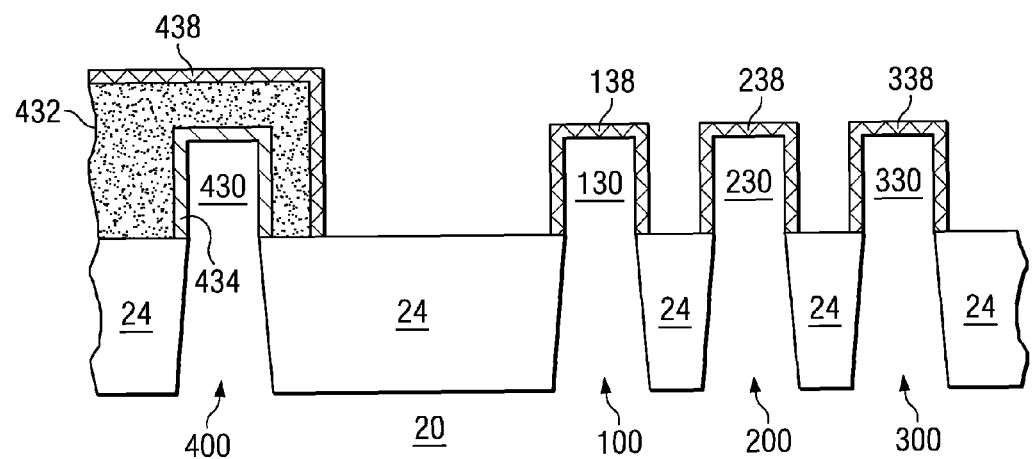

FIG. 2B illustrates a cross-sectional view of the structure shown in FIG. 2A, wherein the cross-sectional view is taken along a plane across line A-A'. The plane crosses the gate portion of FinFET 400, and source/drain portions of FinFETs 100, 200 and 300. FinFET 100 includes gate dielectric 434 and gate electrode 432. In an embodiment, gate electrodes 32 and 432 are formed of polysilicon, and hence gate silicide 438 is formed on the surface of gate electrode 432, and source/drain silicide regions 138, 238 and 338 are formed on fins 130, 230 and 330, respectively. Alternatively, gate electrodes 432 and 32 are formed of a material selected from the group consisting essentially of metals, metal silicides, metal nitrides, and the like. Accordingly, no gate silicide region is formed. Preferably, the source/drain portions of fins 130, 230 and 330 are doped with a same type of impurity. Fins 130, 230, 330 and 430 rise above shallow trench isolation regions (STI) 24, which is further formed in semiconductor substrate 20. In alternative embodiments, fins 130, 230, 330 and 430 may be formed on a silicon-on-insulator (SOI) substrate.

Figure 3:
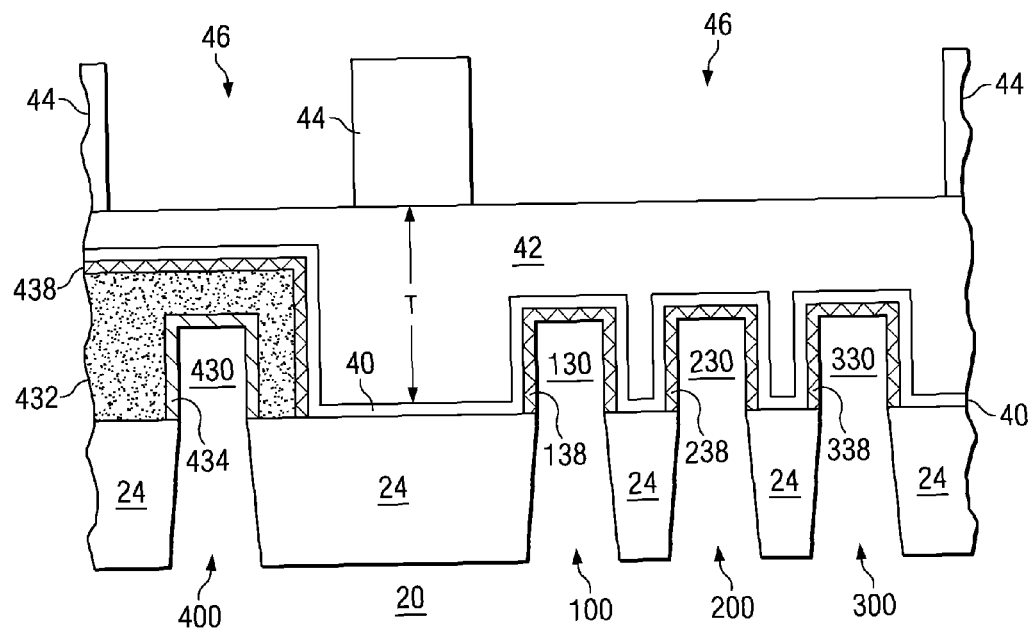

FIGS. 3 through 7 are cross-sectional views taken along the plane crossing line A-A' in FIG. 2A. Referring to FIG. 3, etch stop layer (ESL) 40 is formed over FinFETs 100 through 400, followed by the formation of first inter-dielectric layer (ILD) 42. As is known in the art, ESL 40 may be formed of a dielectric material, such as silicon nitride, silicon oxide, and the like. Preferably, ESL 40 has an inherent tensile stress if the respective FinFETs 100 through 400 are NMOS devices, or an inherent compressive stress if the respective FinFETs are PMOS devices. First ILD 42 may be formed of commonly used ILD materials, such as phosphosilicate glass (PSG), (un-doped silicate glass, selective area chemical vapor deposition (SACVD) oxide, carbon-doped dielectric materials, and combinations thereof. In an exemplary embodiment, first ILD 42 has a thickness T of between about 1500 Å and about 8000 Å. Photo resist 44 is then formed and patterned, forming openings 46.

Figure 4:
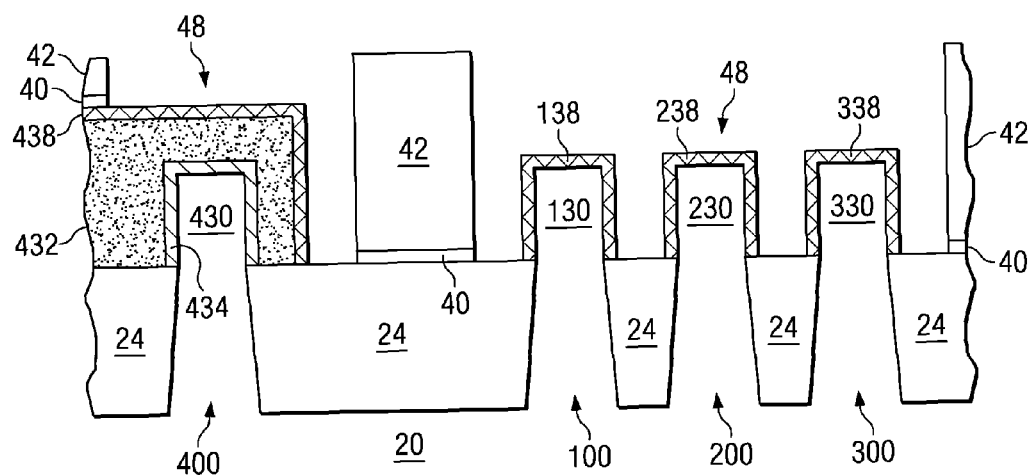

Referring to FIG. 4, the exposed portions of ILD 42 are etched, forming openings 48 in first ILD 42. The portions of ESL 40 exposed through openings 48 are then etched. As a result, gate silicide 438 and source/drain suicides 138, 238 and 338 are exposed. Photo resist 44 is then removed.

Figure 5:
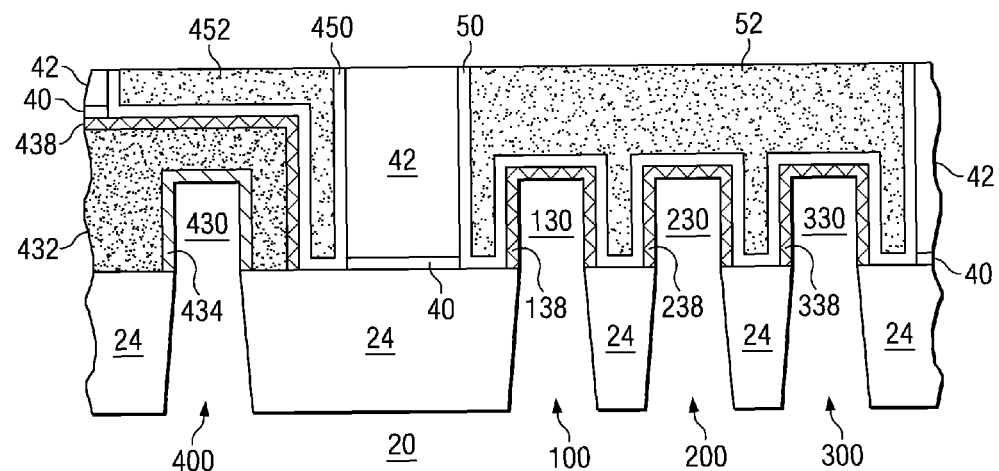

FIG. 5 illustrates the filling of openings 48 to formed contacts 52 and 452. Preferably, a glue layer is formed in openings 48 first, followed by filling the remaining portions of openings 48 with a metallic material. The glue layer may include titanium, titanium nitride, tantalum, tantalum nitride, and combinations thereof. The metallic material may include metals, metal alloys, metal nitrides, and the like. Exemplary metallic materials include titanium, tantalum, tungsten, aluminum, copper, silver, and combinations thereof. A chemical mechanical polish is then performed to remove excess portions of the metallic material and glue layer. The resulting structure includes contacts 52 and 452, which include glue layers 50 and 450 and the corresponding metallic materials filled therein.

Figure 6:
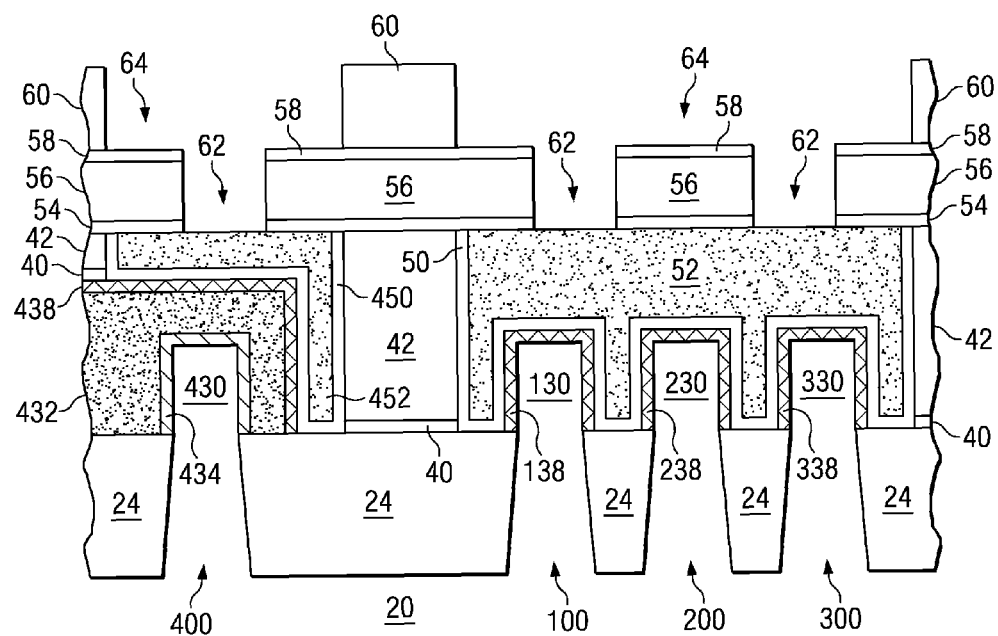
Figure 7:
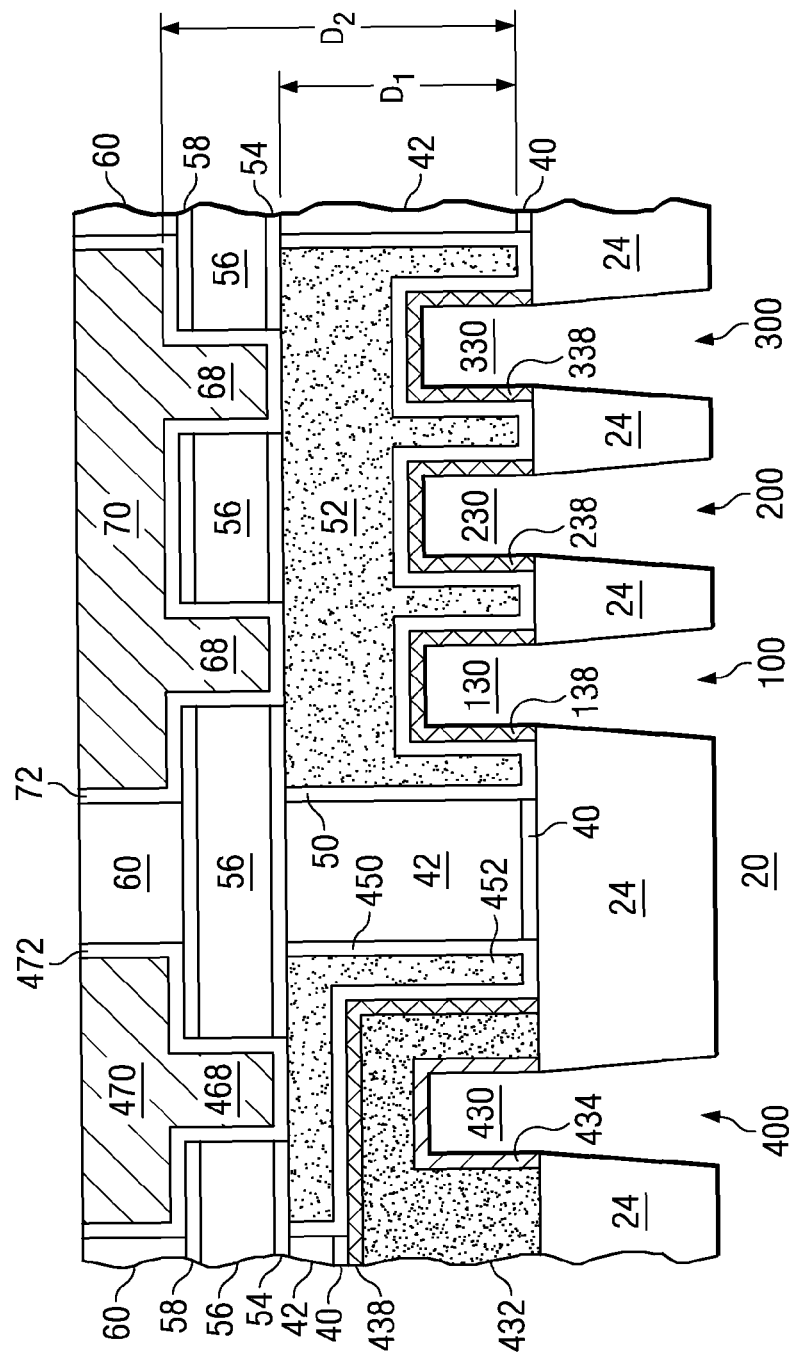

FIGS. 6 and 7 illustrate a dual damascene process. First, as shown in FIG. 6, ESL 54 is formed, followed by the formation of second ILD 56. In an exemplary embodiment, the combined thickness of ESL 54 and second ILD 56 is between about 1000 Å and about 5000 Å. Second ILD 56 may include essentially the same materials as first ILD 42 or different dielectric materials. ESL 58 and inter-metal dielectric (IMD) 60 are then formed. Throughout the description, the term "ILD" is used to indicate the dielectric layers formed under the bottom metallization layer, and the term "IMD" is used to indicate the dielectric layer in which the bottom metallization layer is formed, and the dielectric layers overlying the bottom metallization layer. Further, the "bottom metallization layer" is the lowest metallization layer formed in the bottom IMD layer. Also, the term "bottom IMD" is used to refer to an IMD immediately over the ILD. Via openings 62 and trench openings 64 are then formed. As is known in the art, the formation of via openings 62 and trench openings 64 may use a via-first approach, in which via openings 62 are formed first, or a trench-first approach, in which trench openings 64 are formed first. In the via-first approach, a first photo resist is formed and patterned, and an anisotropic etching cuts through dielectric layers 60, 58 and 56, and stops at ESL 54, forming via openings 62. The exposed ESL 54 is then removed. Next, the first photo resist is removed. A second photo resist is then formed and patterned, and trench openings 64 are formed by etching IMD 60, wherein the etching is stopped at ESL 58. The exposed portion of ESL 58 is then removed, followed by the removal of the second photo resist. One skilled in the art will realize the process steps of the trench-first approach.

Next, as shown in FIG. 7, openings 62 and 64 are filled with conductive materials. Preferably, a diffusion barrier layer is blanket formed, followed by filling the remaining portions of openings 62 and 64 with a conductive material. As is known in the art, the diffusion barrier layer may be formed of titanium, titanium nitride, tantalum, tantalum nitride, and the like. The conductive material preferably includes copper or copper alloys, and may further include metals such as aluminum, silver, tungsten, and combinations thereof. A chemical mechanical polish (CMP) is then performed to remove excess diffusion barrier layer and the conductive material. The resulting structure includes a first dual damascene structure including diffusion barrier layer 472, via 468 and metal line 470, which are electrically connected to gate electrode 432. Further, a second dual damascene include diffusion barrier layer 72, vias 68 and metal line 70, which are electrically connected to source/drain silicide regions 138, 238 and 338, is also formed.

Figure 8:
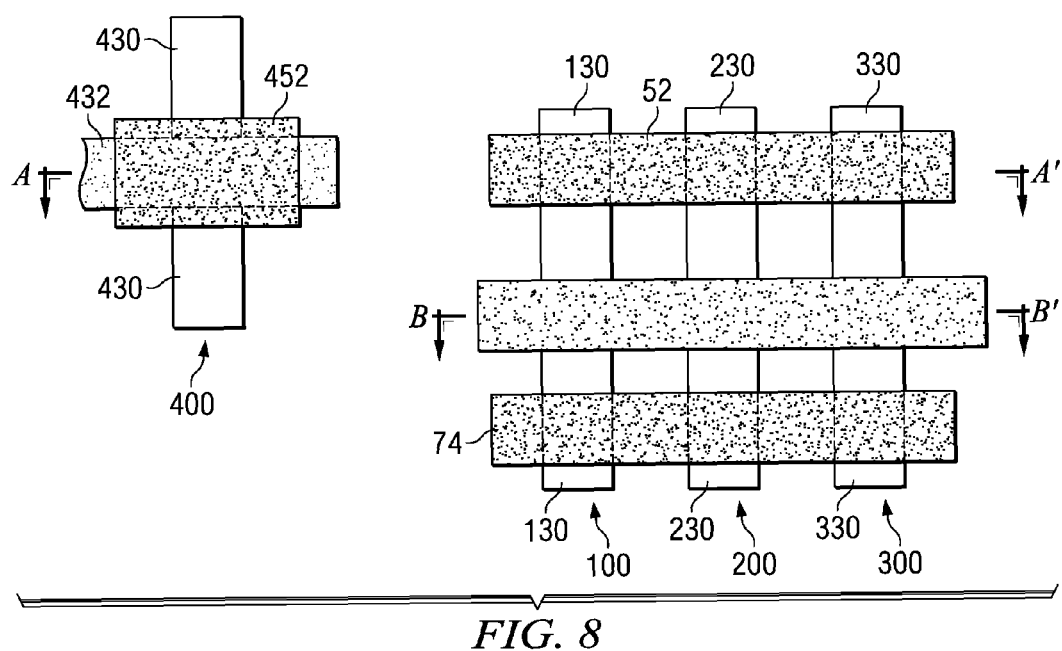

FIG. 8 illustrates a top view of the resulting structure. For a clear view, the dual damascene structures are not shown. Assuming the source/drain regions of FinFETs 100, 200 and 300, which are interconnected by contact 52 are source regions, the drain regions FinFETs 100, 200 and 300 are preferably interconnected by another contact 74, which is preferably formed simultaneously with the formation of contact 52. Another metal line and via (not shown) similar to metal line 70 and via 68 (refer to FIG. 7) may be formed to connect to contact 74. Therefore, FinFETs 100, 200 and 300 act as a single FinFET.

Referring back to FIG. 7, the contact to the source/drain regions of transistors 100, 200 and 300 include two portions, contact 52 and vias 68. As a comparison, in conventional contact formation schemes, the contacts may have a depth up to D2 (if a misalignment occurs and the source/drain contacts extend on sidewalls of fins 130, 230 and 330). Advantageously, because the depth D1 of contact 52 is significantly less than depth D2, and further because contact 52 crosses more than one fin, and hence is wider than a contact connect to only one fin, the resulting aspect ratio of contact 52 is significantly reduced. The contact formation process is thus less difficult.

Figure 9:
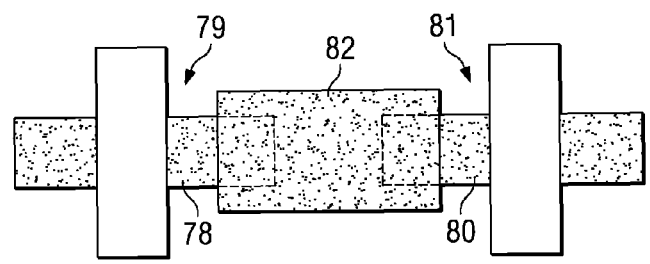
FIG. 9 illustrates a contact connecting two neighboring source/drain regions.

It is realized that although in the embodiment discussed in the preceding paragraphs, contacts are used to connect two sources or two drains of two FinFETs, and in other embodiments, the contacts may be used to connect any of the two neighboring FinFETs. For example, FIG. 9 illustrates source 78 of FinFET 79 connected to drain 80 of a neighboring FinFET 81 by contact 82, wherein contact 82 is further connected to a metal line in M1 by a via (not shown). FinFETs 79 and 81 can both be PFETs, NFETs, or a PFET and an NFET. The contacts may have any shapes other than rectangular shapes. Furthermore, the concept of the present invention can be used to form a connection to only a single source/drain region, where the connection includes a contact and a dual damascene structure.

Figure 2C:
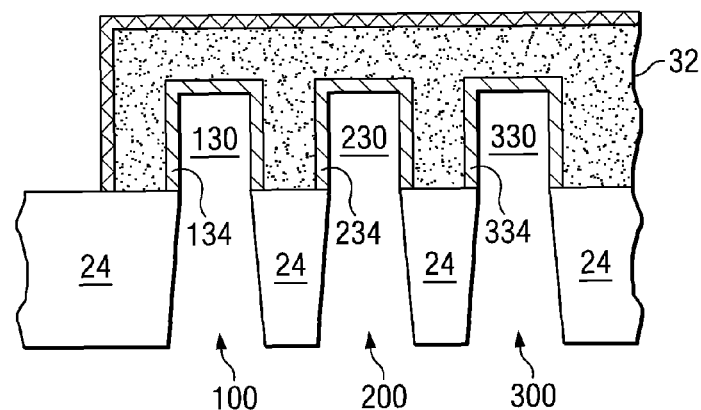
Figure 10:
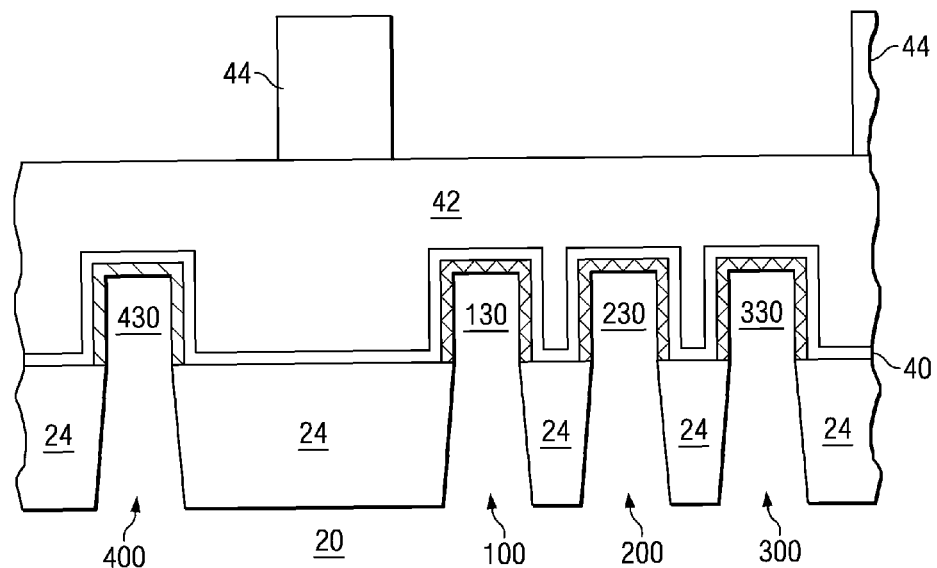
FIGS. 10 and 11 illustrate a second embodiment of the present invention, wherein a contact is used as a gate electrode of a MOSFET.
Figure 11:
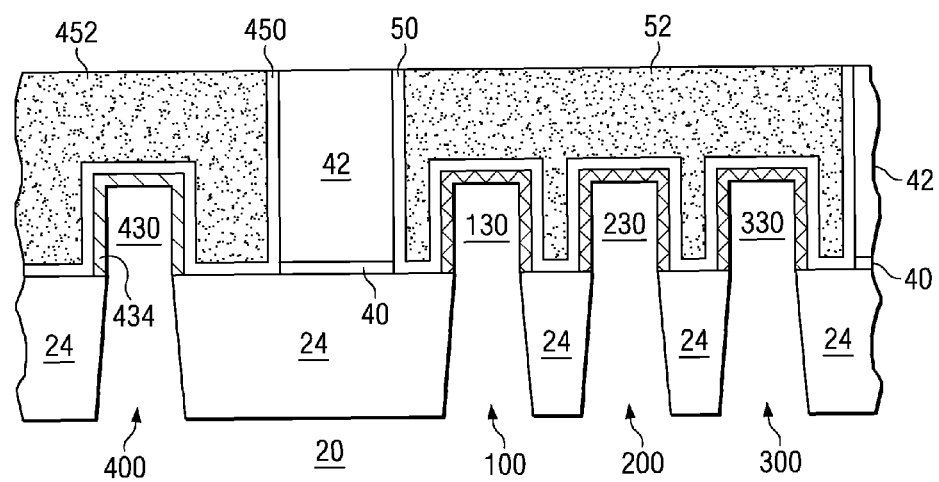

In the previously discussed embodiments, gate electrodes 32 and 432 (refer to FIGS. 2A through 2C) are formed before the formation of contacts 52 and 452. In alternative embodiments, gate electrodes 32 and 432 are formed simultaneously with the formation of contacts 52 and 452, and gate electrode themselves are also contacts. The cross-sectional views of this embodiment are briefly illustrated in FIGS. 10 through 11. FIG. 10 is similar to FIG. 2A, except gate electrodes 432 (and gate electrode 32 as shown in FIG. 2C) is not formed. Next, ESL 40 is blanket formed, followed by the formation and patterning of first ILD 42. Photo resist 44 is then formed. In FIG. 11, the exposed portions of ILD 42 are etched, and contacts 52 and 452 are formed, using essentially the same process as illustrated in FIGS. 3 through 5. As a result, contact 452 acts as the gate electrode of FinFET 400. Advantageously, this embodiment combines the formation of gate electrodes and contacts, and thus has less process steps.

Figure 12:
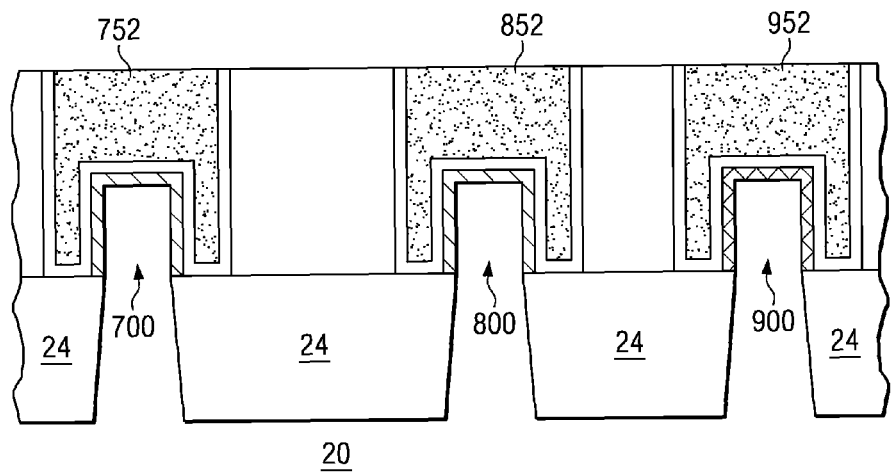
FIG. 12 illustrates a first contact used as a gate electrode of a PFET and a second contact used as a gate electrode of an NFET.

In an embodiment, FinFET 100 is of n-type, and hence gate electrode 452 has a low work function, for example, less than about 4.2 eV. Alternatively, FinFET 100 is of p-type, and hence gate electrode 452 has a high work function, for example, greater than about 4.9 eV. In yet other embodiments, as shown in FIG. 12, a semiconductor chip includes contacts 752 and 852 with different work functions, wherein contact 752 has a higher work function than contact 852. Preferably contact 752 is used as the gate electrode of PFET 700, while contact 852 is used as the gate electrode of NFET 800. Contact 952 is connected to a source/drain region of MOSFET 900, and can be formed simultaneously with either contact 752 or contact 852.

Referring back to FIG. 8, please note that FinFET 400 may have a substantially same structure as FinFETs 100, 200 and 300. Therefore, the formation of the gate electrode of FinFET 400 may be performed simultaneously with the formation of the gate electrodes of FinFETs 100, 200 and 300. Similarly, the formation of the contact structures of FinFETs 100, 200 and 300 may also be performed simultaneously with in the formation of the contact structure of FinFET 400. For this reason, the cross-sectional view of the gate portion of FinFET 400 may be considered as the cross-sectional view of the gate portions of FinFET 100, 200, or 300.

Figure 13:
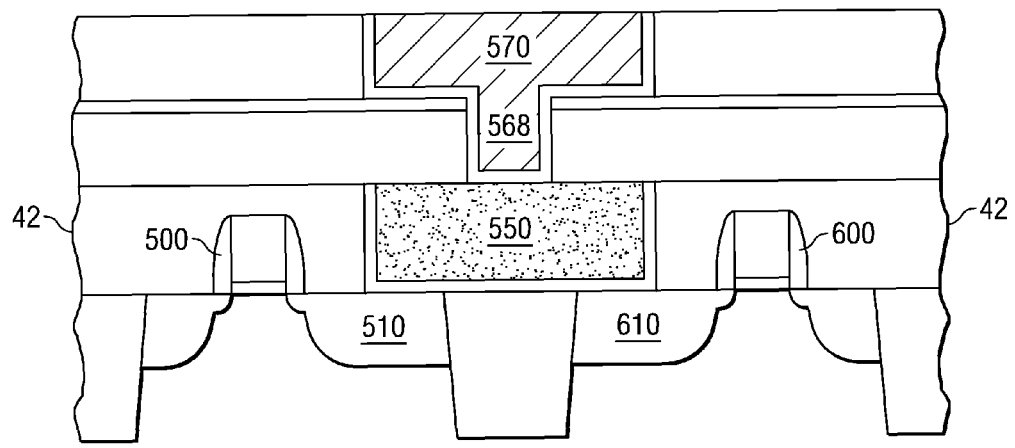
FIG. 13 illustrates a contact for connecting two planar MOSFETs.

The teaching of the present invention may also be applied to the formation of contacts to planar devices. FIG. 13 illustrates two planar MOSFETs 500 and 600. Source/drain region 510 and source/drain region 610 are interconnected by contact 550, which is formed in first ILD 42. A dual damascene structure including via 568 and metal 570 are further connected to contact 550. One skilled in the art will realize the corresponding process steps by applying the teaching of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a substrate;
a first Fin field-effect transistor (FinFET) at a top surface of the substrate, the first FinFET comprising:
a first fin;
a first gate dielectric on a top surface and sidewalls of the first fin;
a first gate electrode on the first gate dielectric;

a first source/drain region in a portion of the first fin uncovered by the first gate dielectric; and a first source/drain silicide region on the first source/drain region;

a second FinFET at the top surface of the substrate, the second FinFET comprising:

a second fin;

a second gate dielectric on a top surface and sidewalls of the second fin;

a second gate electrode on the second gate dielectric;

a second source/drain region in a portion of the second fin uncovered by the second gate dielectric; and a second source/drain silicide region on the second source/drain region;

a first inter-layer dielectric (ILD) over the first and the second FinFETs;

a second ILD over the first ILD;

a contact plug contacting the first and the second source/drain silicide regions, wherein the contact plug comprises a sidewall extending continuously from a top surface of the first ILD to lower than top surfaces of the first and the second source/drain silicide regions, with the sidewall being substantially vertical with substantially no horizontal shift, and wherein the contact plug includes a contiguous structure which extends over the first fin and the second fin and interposes the first fin and the second fin;

a bottom inter-metal dielectric (IMD) over the second ILD; and a dual damascene structure comprising a metal line in the bottom IMD and a via in the second ILD, wherein the via has a bottom surface contacting a top surface of the contact plug.

2. The semiconductor structure of claim 1, wherein the contact plug is electrically connected to the first source/drain region of the first finFET.

3. The semiconductor structure of claim 2, wherein the contact plug is further electrically connected to the second source/drain region of the second finFET.

4. The semiconductor structure of claim 1, wherein each of the first and the second finFETS comprises an additional source/drain region, wherein the first and the second gate electrodes are electrically interconnected, and wherein the additional source/drain regions of the first and the second finFETs are interconnected by an additional contact plug.

5. The semiconductor structure of claim 1, wherein the first finFET further comprises a gate silicide over the first fin, and wherein a glue layer contacts the gate silicide.

6. The semiconductor structure of claim 5, wherein the glue layer adjoins the first ILD and the gate silicide.

7. The semiconductor structure of claim 1, wherein the dual damascene structure comprises a continuous metal region extending from the metal line into the via, and a diffusion barrier layer separating the continuous metal region from the second ILD and the bottom IMD.

8. The semiconductor structure of claim 1, wherein the contact plug forms a single and unbroken metal line electrically connecting more than two FETs.

9. The semiconductor structure of claim 1, wherein the first and the second source/drain regions are source regions, and wherein the first and the second gate electrodes are electrically interconnected.

10. The semiconductor structure of claim 1, wherein the first gate electrode has a top surface level with the top surface of the first ILD, and wherein the first gate electrode and the contact plug comprise same materials.

11. The semiconductor structure of claim 1, wherein the first FinFET is a PFET, and the second FinFET is an NFET, and wherein one of the first and the second gate electrodes has a top surface level with the top surface of the first ILD, and wherein the first and the second gate electrodes comprise different materials.

12. The semiconductor structure of claim 1 further comprising:

a shallow trench isolation (STI) region horizontally between, and vertically below, the first and the second fins; and an etch stop layer (ESL) on the STI region, wherein the ESL adjoins the contact plug and the STI region.

13. The semiconductor structure of claim 1, wherein the contact plug comprises tungsten.

* * * * *